United States Patent [19]
Yoshikawa

[11] Patent Number: 6,157,229
[45] Date of Patent: Dec. 5, 2000

[54] SKEW COMPENSATION DEVICE

[75] Inventor: Takefumi Yoshikawa, Osaka, Japan

[73] Assignee: Matsushita Electric Industrial Co., Ltd., Osaka, Japan

[21] Appl. No.: 09/160,857

[22] Filed: Sep. 25, 1998

[30] Foreign Application Priority Data

Sep. 29, 1997 [JP] Japan ..................................... 9-263192

[51] Int. Cl.$^7$ ...................................................... H03L 7/00
[52] U.S. Cl. .......................... 327/149; 327/147; 327/153; 327/158
[58] Field of Search .................................. 327/244, 236, 327/276, 155, 161, 162, 163, 160, 277, 147, 149, 150, 153, 156, 158, 159; 357/355, 376

[56] References Cited

U.S. PATENT DOCUMENTS

| | | | |
|---|---|---|---|
| 5,043,596 | 8/1991 | Masuda et al. | 327/297 |
| 5,923,609 | 7/1999 | Roscher et al. | 365/230.06 |
| 5,994,934 | 11/1999 | Yoshimura et al. | 327/158 |

FOREIGN PATENT DOCUMENTS

| | | |
|---|---|---|
| 05199088 | 8/1993 | Japan . |
| 05233093 | 10/1993 | Japan . |
| 07098617 | 11/1995 | Japan . |
| 08111675 | 4/1996 | Japan . |

OTHER PUBLICATIONS

T. Hamamoto et al., "400MHz Random Column Operating SDRAM Techniques with Self Skew Compensation", 1997 Syposium on VLSI Circuits, Digest of Technical Papers, pp. 105–106.

*Primary Examiner*—Tuan T. Lam
*Assistant Examiner*—Hiep Nguyen
*Attorney, Agent, or Firm*—McDermott, Will & Emery

[57] ABSTRACT

A transition detector for providing a pulse signal upon detection of a transition occurring in an input data signal, a variable delay line for generating a first delayed data signal which lags the input data signal by a variable delay amount, a fixed delay line for generating a second further delayed data signal which lags the first delayed data signal by a fixed delay amount, and a phase comparator for comparing a transition of the second delayed data signal with a clock signal phase are disposed. The phase comparator controls the delay amount of the variable delay line such that the transition of the second delayed data signal is substantially phase matched with a rise edge of the clock signal. The first delayed data signal is output together with the clock signal.

5 Claims, 7 Drawing Sheets

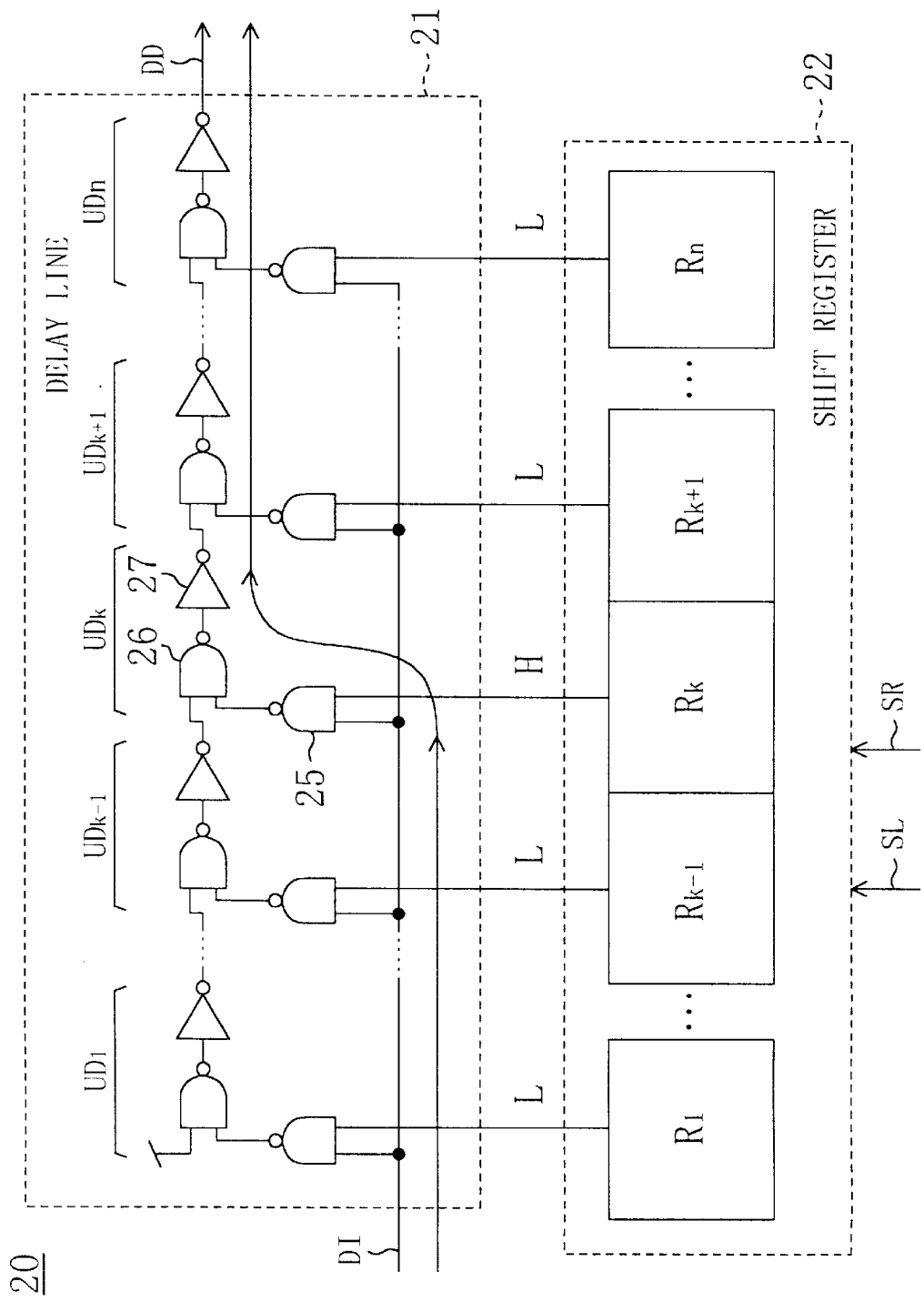

even when data signals are generated in such a way as to secure a given setup time period for clock signals, there is produced a skew (a "deviation" in time) between the clock signal and a data signal if there is a difference in propagation delay time between these signals. As a result, phase relationship problems may occur between clock and data signals received by the data receiving component. When data are transmitted at a high speed, the data are likely to be received with errors.

SKEW COMPENSATION DEVICE

BACKGROUND OF THE INVENTION

The present invention relates to a skew compensation device for compensating for a skew between a data signal and a clock signal.

It is required that in various data receiving components including D latches, data signals are determined before more than the definite time period (called the setup time period) from a clocking edge of the clock signal. Even when data signals are generated in such a way as to secure a given setup time period for clock signals, there is produced a skew (a "deviation" in time) between the clock signal and a data signal if there is a difference in propagation delay time between these signals. As a result, phase relationship problems may occur between clock and data signals received by the data receiving component. When data are transmitted at a high speed, the data are likely to be received with errors.

Hamamoto and the others disclosed a skew compensation device in a paper entitled "400 MHz Random Column Operating SDRAM Techniques with Self Skew Compensation," 1997 Symposium on VLSI Circuits, Digest of Technical Papers, pp. 105–106. This skew compensation device has the following components: a fixed delay line for generating a delayed data signal which lags an input data signal by a fixed amount of delay; a variable delay line for generating a delayed clock signal which lags the input clock signal by a variable amount of delay; and a phase comparator for comparing a transition of the delayed data signal with a phase of the delayed clock signal and for controlling the delay amount of the variable delay line so that the delayed data signal transition is substantially phase matched with a clocking edge of the delayed clock signal. The skew compensation device outputs the delayed clock signal as a clock signal for latching the input data signal. This technique secures a data setup time period coincident with the delay amount of the fixed delay line.

A typical skew compensation device operates only in setup mode when power is turned on and "sleeps" in normal operating mode, resulting in producing some problems. One problem is that it is impossible for such a skew compensation device to perform, in a normal operating mode, skew compensation operations according to environmental changes such as an increase in temperature. The reason is that if the skew compensation device is forced to uninterruptedly operate, the phase comparator will malfunction when both of the input data signal and the delayed data signal undergo no transition therefore holding respective constant logical levels.

SUMMARY OF THE INVENTION

An object of the present invention is to provide a technique capable of compensating for a skew between a clock signal and a data signal not only in a setup mode but also in a normal operating mode.

In order to achieve the object, the present invention uses a technique in which control of a variable delay line by a phase comparator becomes valid only when there is a transition of the input data signal. Additionally, delayed data signal generation is carried out concurrently with input data signal transition detection, and a generated delayed data signal and a received clock signal are output from a skew compensation device of the present invention. In accordance with the present invention, the variable delay line and the phase comparator adjust not a delayed clock signal but a delayed data signal to a target phase.

A first skew compensation device of the present invention is described. The first skew compensation device of the present invention is for performing compensation for skew between an input data signal and a clock signal and uses an architecture comprising: (a) a transition detector for detecting a transition of the input data signal and for providing a pulse signal representative of the transition detection, (b) a variable delay line for generating a first delayed data signal which lags the input data signal by a variable delay amount, (c) a fixed delay line for generating a second further delayed data signal which lags the first delayed data signal by a fixed delay amount, and (d) a phase comparator for comparing a transition of the second delayed data signal with a phase of the clock signal. In addition to the comparison capability, the phase comparator sends to the variable delay line (i) a first control signal for increasing the variable delay amount when the transition of the second delayed data signal leads a clocking edge of the clock signal and (ii) a second control signal for decreasing the variable delay amount when the transition of the second delayed data signal lags the clocking edge of the clock signal, provided that the phase comparator receives the pulse signal from the transition detector. Thereafter the first delayed data signal is output from the first skew compensation device of the present invention.

Aspects of the first skew compensation device of the present invention are described. In accordance with the first skew compensation device of the present invention, the control of the variable delay line by the phase comparator becomes valid only when there occur transitions in the input data signal. The phase comparator will not malfunction in a setup mode as well as in a normal operating mode. As long as there are transitions of the input data signal, the phase comparator adequately adjusts the delay amount of the variable delay line so that the transition of the second delayed data signal can substantially be phase matched with the clocking edge of the clock signal, and a data setup time period coincident with the delay amount of the fixed delay line is secured.

A second skew compensation device of the present invention is described. The second skew compensation device of the present invention is for performing compensation for skew between an input data signal and a clock signal and uses an architecture comprising: (a) a transition detector for detecting a transition of the input data signal and for providing a pulse signal representative of the transition detection, (b) a first variable delay line for generating a first delayed data signal which lags the input data signal by a variable delay amount, (c) a first phase comparator for comparing a transition of the first delayed data signal with a phase of the clock signal, (d) a second variable delay line for generating a second further delayed data signal which lags the first delayed data signal by a variable delay amount, and (e) a second phase comparator for comparing a transition of the second delayed data signal with the phase of the clock signal. On the condition that the first phase comparator receives the pulse signal from the transition detector, the first phase comparator sends to the first variable delay line (i) a first control signal for increasing the variable delay amount of the first variable delay line when the transition of the first delayed data signal leads a first clocking edge (for example, a fall edge) of the clock signal and (ii) a second control signal for decreasing the variable delay amount of the first variable delay line when the transition of the first delayed data signal lags the first clocking edge of the clock signal. On the condition that the second phase comparator receives the pulse signal from the transition detector, the second phase comparator sends to the second variable delay line (i)

a third control signal for increasing the variable delay amount of the second variable delay line when the transition of the second delayed data signal leads a second clocking edge (for example, a rise edge) of the clock signal and (ii) a fourth control signal for decreasing the variable delay amount of the second variable delay line when the transition of the second delayed data signal lags the second clocking edge of the clock signal. Thereafter, a delayed data signal at a mid-point of the second variable delay line is output from the second skew compensation device of the present invention.

Aspects of the second skew compensation device of the present invention are described. In accordance with the second skew compensation device of the present invention, the control of the first variable delay line by the first phase comparator and the control of the second variable delay line by the second phase comparator become valid only when there occur transitions in the input data signal. These first and second phase comparators will not malfunction in a setup mode as well as in a normal operating mode. As long as there are transitions of the input data signal, the first phase comparator adequately adjusts the delay amount of the first variable delay line so that the transition of the first delayed data signal can substantially be phase matched with the first clocking edge of the clock signal. As long as there are transitions of the input data signal, the second phase comparator adequately adjusts the delay amount of the second variable delay line so that the transition of the second delayed data signal can substantially be phase matched with the second clocking edge of the clock signal. Additionally, with respect to the second clocking edge of the clock signal, a data setup time period corresponding to a mid-point position of the second variable delay line is secured. If a delayed data signal is output from a central position of the second variable delay line, this provides convenience that a data setup time period and a data hold time period are secured.

BRIEF DESCRIPTION OF THE DRAWINGS

FIG. 3 illustrates in block diagram form an example of the internal architecture of a variable delay line of FIG. 1.

DETAILED DESCRIPTION OF THE INVENTION

Figure 1:
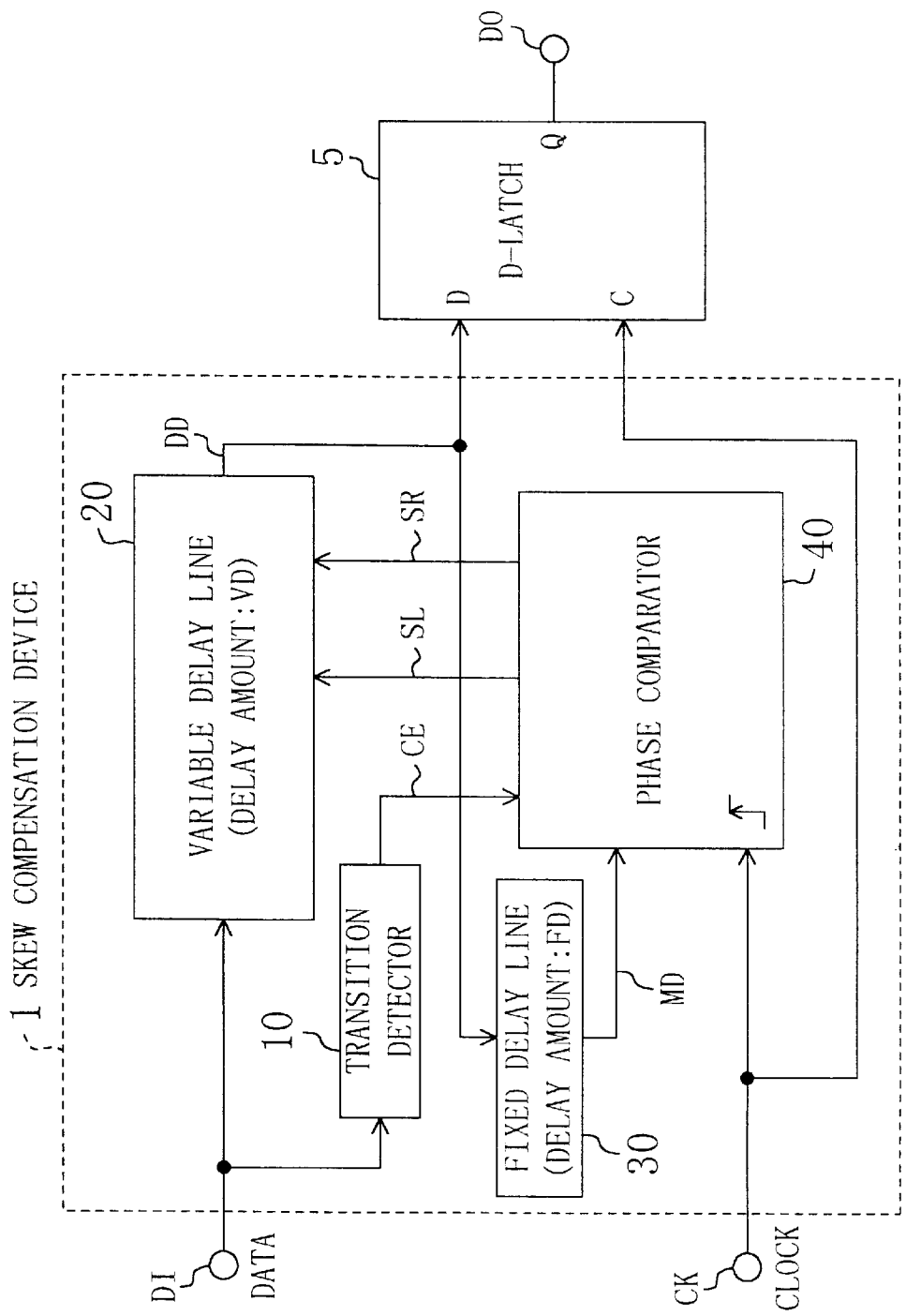
FIG. 1 illustrates in block diagram form an example of the architecture of a skew compensation device in accordance with the present invention.

FIG. 1 shows a skew compensation device (SCD) 1 in accordance with the present invention. The SCD 1 of FIG. 1 is operable to compensate for a skew between an input data signal DI and a clock signal CK. The SCD 1 provides a delayed data signal DD to a D latch 5 (which is one type of data receiving component) with two input terminals (a data input terminal D and a clock input terminal C) and an output terminal Q. This latch 5 receives the delayed data signal DD and the clock signal CK at the data input terminal D and at the clock input terminal C respectively, latches the delayed data signal DD synchronously with a rise edge of the clock signal CK, and provides an output data signal DO at the output terminal Q. The SCD 1 and the D latch 5 together form a single input buffer.

The SCD 1 has a transition detector 10, a variable delay line 20, a fixed delay line 30, and a phase comparator 40. The transition detector 10 is disposed to detect rise transitions of an input data signal DI and to provide a pulse signal CE representative of such a rise transition detection. The variable delay line 20 is disposed to generate the delayed data signal DD which lags the input data signal DI by a variable delay amount VD. The fixed delay line 30 is disposed to generate a further delayed data signal MD which lags the delayed data signal DD by a fixed delay amount FD. The phase comparator 40 is disposed to compare a rise transition of the delayed data signal MD with a phase of the clock signal CK. On the condition that the pulse signal CE is delivered from the transition detector 10, the phase comparator 40 provides a first control signal SL or a second control signal SR. In other words, when a rise transition of the delayed data signal MD leads a rise edge of the clock signal CK, the phase comparator 40 provides the first control signal SL to the variable delay line 20 so as to increase the variable delay amount VD of the variable delay line 20. On the other hand, when a rise transition of the delayed data signal MD lags a rise edge of the clock signal CK, the phase comparator 40 provides the second control signal SR to the variable delay line 20 so as to decrease the variable delay amount VD of the variable delay line 20.

Figure 2:
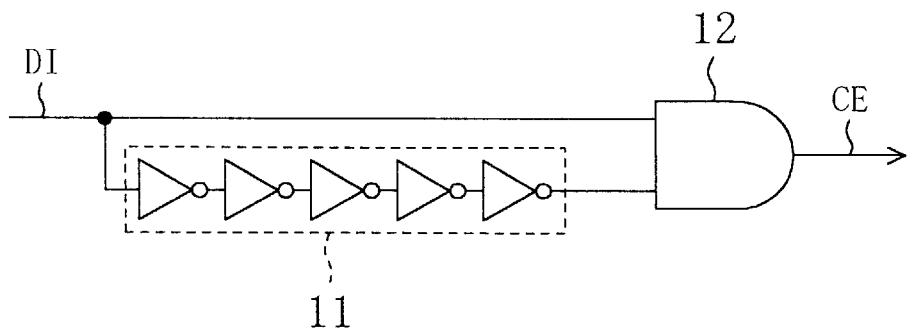
FIG. 2 is a circuit diagram illustrating an example of the internal architecture of a transition detector of FIG. 1.

Referring now to FIG. 2, therein shown is an example of the internal structure of the transition detector 10 shown in FIG. 1. This transition detector 10 of FIG. 2 has a chain of inverters 11 of an odd number of stages (five stages in the figure) and a single AND gate 12. The transition detector 10 is disposed to provide the pulse signal CE whose pulse width is determined by the number of stages of the inverter chain 11 and which enters its HIGH level state at a transition point (from LOW to HIGH) of the input data signal DI.

FIG. 3 shows an example of the internal structure of the variable delay line 20. The variable delay line 20 of FIG. 3 has a delay line 21 with a structure of n stages where the number n is any integer and a shift register 22 with a structure of n stages. The delay line 21 is formed of n unit delay elements UDk (k=1 to n). Each unit delay element has two NAND gates 25 and 26 and a single inverter 27. The shift register 22 is formed of n register elements Rk (k=1 to n). One of these n register elements holds a signal at the level of HIGH and the other remaining register elements each hold a signal at the level of LOW. Such a HIGH level signal held in the shift register 22 is shifted one stage to the left when one pulse is applied as the first control (left shift) signal SL. On the other hand, the HIGH level signal is shifted one stage to the right when one pulse is applied as the second control (right shift) signal SR. If the k-th register element Rk holds a HIGH level signal as shown in FIG. 3, then a NAND gate 25 of the corresponding unit delay element UDk is made active, as a result of which the delayed data signal DD is generated from the input data signal DI by the (n−k+1) unit delay elements. In other words, the delay amount VD is determined by these (n−k+1) unit delay elements. The delay amount VD is variable. The delay amount VD is increased by one step when one pulse is supplied as the first control signal SL while it is decreased by one step when one pulse is supplied as the second control signal SR. The description of the internal structure of the fixed delay line 30 of FIG. 1 is omitted.

Figure 4:
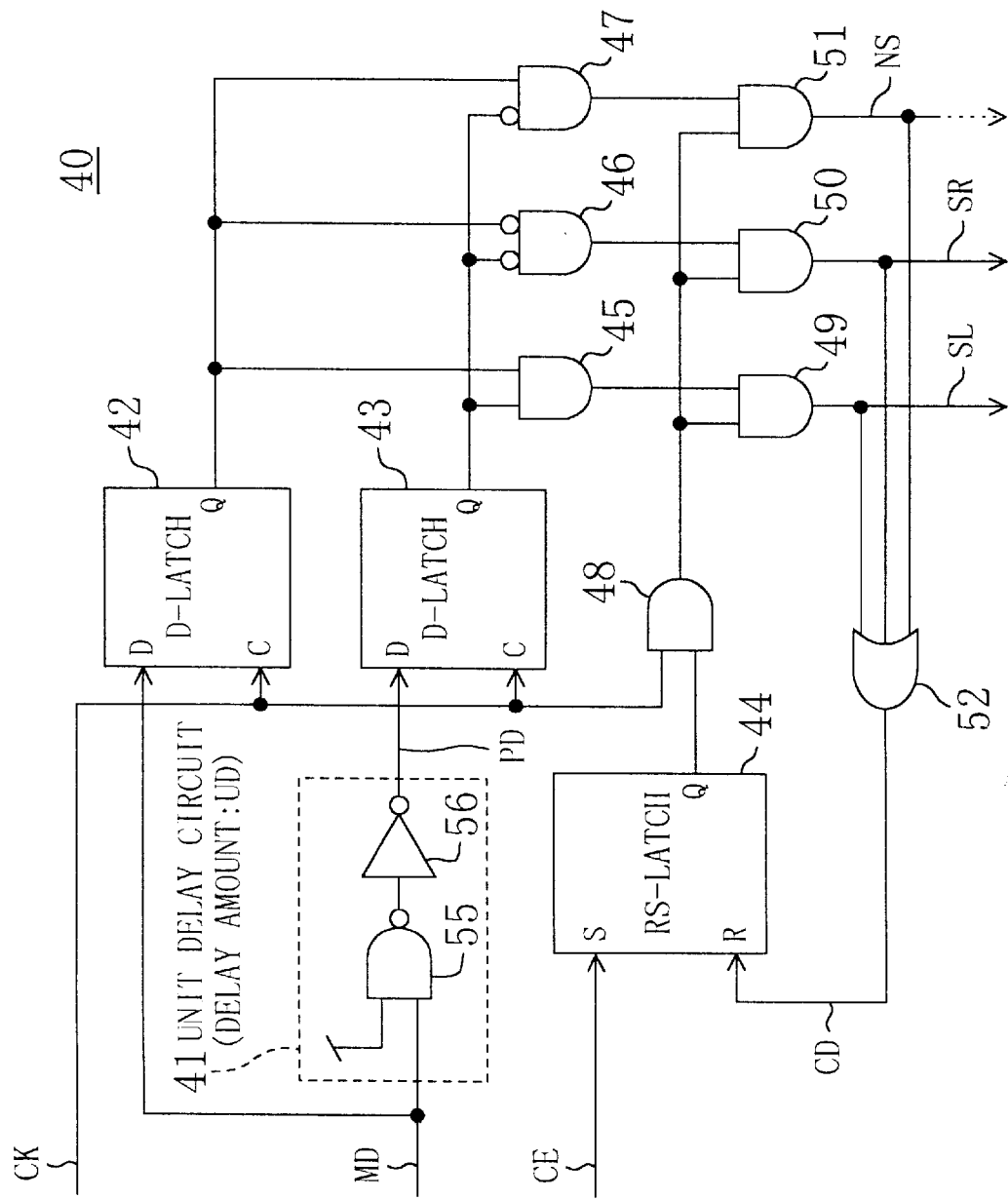
FIG. 4 illustrates in block diagram form an example of the internal architecture of a phase comparator of FIG. 1.

FIG. 4 illustrates an example of the internal structure of the phase comparator 40 shown in FIG. 1. The phase comparator 40 of FIG. 4 has a single unit delay circuit 41, two D latches 42 and 43, a single RS latch 44, three logical gates 45–47, four AND gates 48–51, and a single OR gate 52. The unit delay circuit 41 is for generating a further delayed data signal PD which lags the delayed data signal MD from the fixed delay line 30 by a certain unit delay amount UD. The unit delay circuit 41 is made up of a single NAND gate 55 and a single inverter 56. The D latch 42 with a data input terminal D and a clock input terminal C receives the delayed data signal MD and the clock signal CK at the data input terminal D and at the clock input terminal C respectively and latches the delayed data signal MD synchronously with a rise edge of the clock signal CK. On the other hand, the D latch 43 with a data input terminal D and a clock input terminal C receives the delayed data signal PD and the clock signal CK at the data input terminal D and at the clock input terminal C respectively and latches the delayed data signal PD synchronously with a rise edge of the clock signal CK. The logical gate 45 provides a signal at the level of HIGH to one of inputs of the AND gate 49 if (i) Q output from the D latch 42 is HIGH and (ii) Q output from the D latch 43 is HIGH. The logical gate 46 provides a signal at the level of HIGH to one of inputs of the AND gate 50 if (i) Q output from the D latch 42 is LOW and (ii) Q output from the D latch 43 is LOW. The logical gate 47 provides a signal at the level of HIGH to one of inputs of the AND gate 51 if (i) Q output from the D latch 42 is HIGH and (ii) Q output from the D latch 43 is LOW. The AND gate 48 provides a signal representative of a logical product (AND) of the clock signal CK and the Q output of the RS latch 44 to the other inputs of the AND gates 49–51. The output of the AND gate 49 is the first control (right shift) signal SL, and the output of the AND gate 50 is the second control (left shift) signal SR. The output of the AND gate 51 is a non-shift signal NS indicating that no HIGH level signal shift operation is required in the shift register 22. The OR gate 52 provides a logical sum signal CD representative of a logical sum (OR) of the three signals SL, SR, and NS to a reset terminal R of the RS latch 44. The pulse signal CE from the transition detector 10 is applied to a set terminal S of the RS latch 44. In other words, the Q output of the RS latch 44 is set HIGH by the pulse (comparison enable) signal CE. Either the signal SL, the signal SR, or the signal NS is asserted when the Q output of the RS latch 44 is set, and the point any one of these three signals is asserted the Q output of the RS latch 44 is reset to LOW by the logical sum (comparison disable) signal CD. Each signal SL, SR, and NS is a pulse signal that is generated every time the comparison enable signal CE is supplied.

Figure 5:
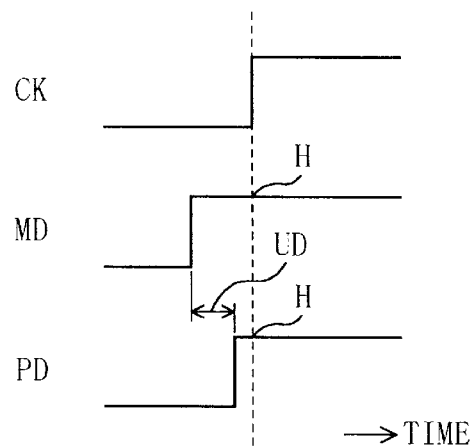
FIG. 5 is a timing diagram depicting a phase relationship among three different signals of FIG. 4 and shows an example in which a rise transition of the data signal leads a rise edge of the clock signal.

FIG. 5 is a timing diagram showing a phase relationship among the three signals CK, MD, and PD of FIG. 4 and shows an example in which a rise transition of the delayed data signal MD leads a rise edge of the clock signal CK. In this case, the two D latches 42 and 43 each provide a Q output signal at the level of HIGH and a signal output from the logical gate 45 is therefore asserted. As a result, a pulse of the left shift signal SL is generated so that the delay amount VD of the variable delay line 20 can be increased by one step, provided that the compare enable signal CE is supplied.

Figure 6:
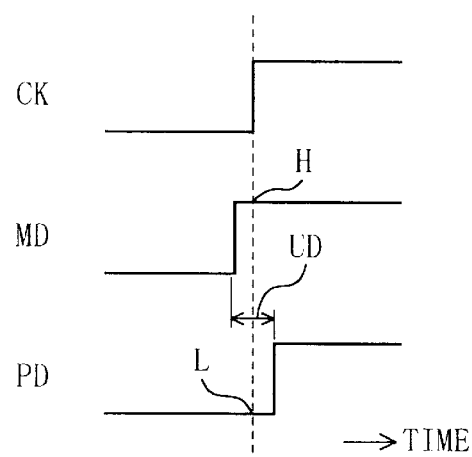
FIG. 6 is a timing diagram depicting another phase relationship among the three signals of FIG. 4 and shows an example in which a rise transition of the data signal is substantially phase matched with a rise edge of the clock signal.

FIG. 6 shows an example in which a rise transition of the signal MD is substantially matched in phase with a rise edge of the signal CK. In this case, the D latch 42 provides a Q output signal at the level of HIGH while the D latch 43 provides a Q output signal at the level of LOW and a signal output from the logical gate 47 is therefore asserted. As a result, a pulse of the non-shift signal NS is generated, provided that the compare enable signal CE is supplied. In this case, no pulses of the shift signals SL and SR are generated. The non-shift signal NS can be used in other circuits (not shown).

Figure 7:
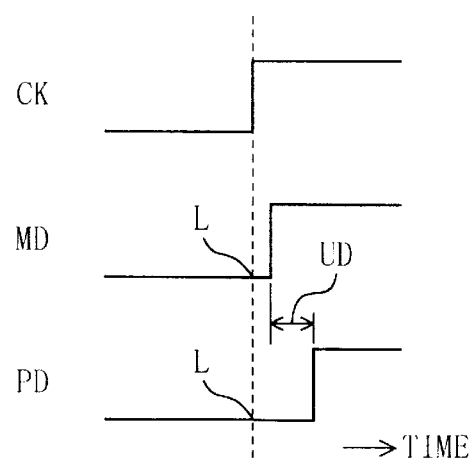
FIG. 7 is a timing diagram depicting a phase relationship among the three signals of FIG. 4 and shows an example in which a rise transition of the data signal lags a rise edge of the clock signal.

FIG. 7 shows an example in which a rise transition of the signal MD lags a rise edge of the signal CK. In this case, the two D latches 42 and 43 each provide a Q output signal at the level of LOW and a signal output from the logical gate 46 is asserted. As a result, a pulse of the right shift signal SR is generated so that the delay amount VD of the variable delay line 20 is decreased by one step, provided that the compare enable signal CE is supplied.

Figure 8:
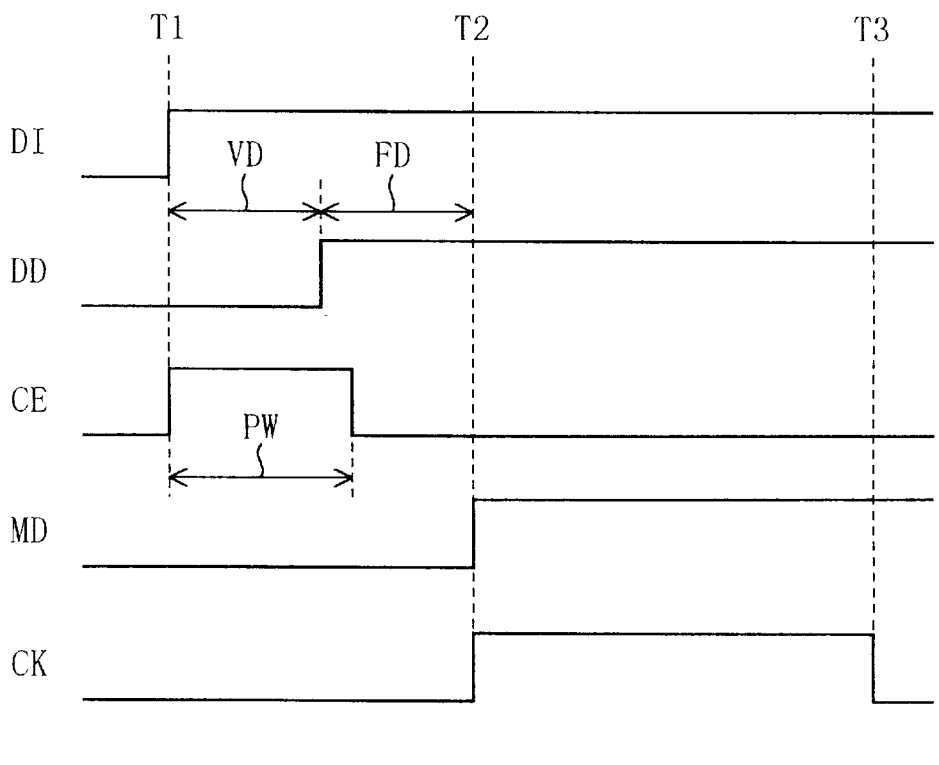
FIG. 8 is a timing diagram depicting a phase relationship among five different signals of FIG. 1 at a point in time when a skew compensation operation is completed.

FIG. 8 shows a phase relationship among the five signals (DI, DD, CE, MD and CK) of FIG. 1 at a point in time when a skew compensation operation is completed. FIG. 8 shows that the input data signal DI makes a transition in level from LOW to HIGH at time T1. The transition detector 10 detects such a transition and provides the pulse signal CE having a given pulse width PW to the phase comparator 40. As a result, the phase comparator 40 is placed in the enable state. Meanwhile, the variable delay line 20 generates the signal DD which lags the signal DI by the delay amount VD and the fixed delay line 30 generates the signal MD which lags the signal DD by the delayed amount FD, at which time the phase comparator 40 controls the delay amount VD of the variable delay line 20 by time T3 (the fall time of the clock signal CK) so that a rise transition of the signal MD is substantially matched in phase with a rise edge of the signal CK at time T2. Accordingly, for the D latch 5 of FIG. 1, a length of time coincident with the delay amount FD of the fixed delay line 30 is secured as a setup time of the signal DD with respect to the rise edge of the signal CK.

The initial setting of the delay amount VD of the variable delay line 20, i.e., the initial setting of the shift register 22, is carried out in setup mode when power is turned on. Quick completion of the initial setting in a setup mode can be achieved by just making the signals DI and CK change in state at the same cycle. Even in normal operating mode, the skew compensation device 1 of FIG. 1 is able to perform a skew compensation operation according to environmental changes such as an increase in temperature. If the signal DI makes no transitions thereby holding a constant logical level, the phase comparator 40 is then kept in the disable state, so that the setting of the shift register 22 will not be changed at random.

Figure 9:
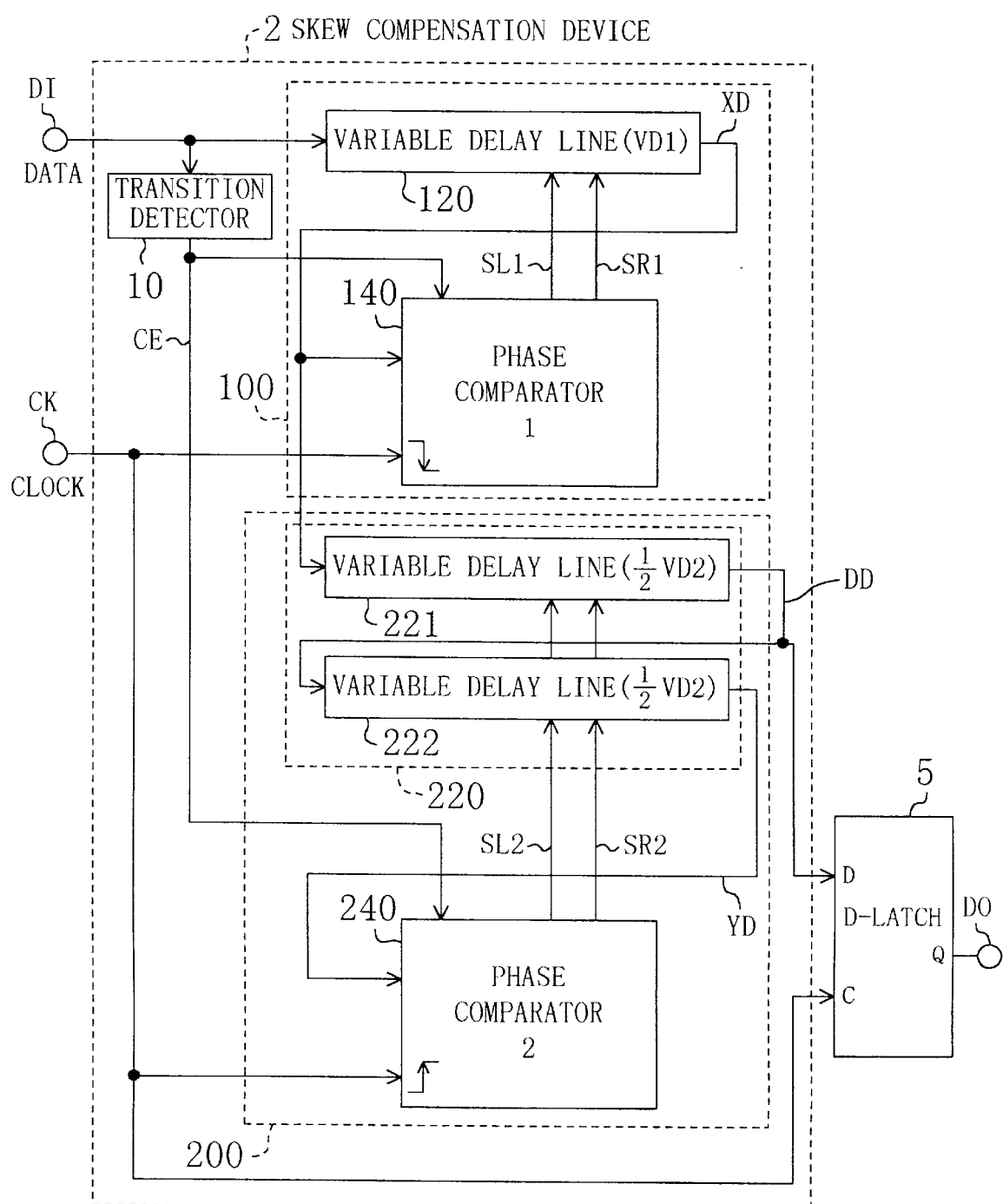
FIG. 9 illustrates in block diagram form another example of the architecture of the skew compensation device in accordance with the present invention.

FIG. 9 shows another skew compensation device (SCD 2) in accordance with the present invention. This SCD 2 of FIG. 9 is a device for compensating for skew between the input data signal DI and the clock signal CK and has the capability of providing the delayed data signal DD to the D latch 5 which is one type of data receiving component. The latch 5 receives the delayed data signal DD and the clock signal CK at the data input terminal D and at the clock input terminal C respectively, latches the delayed data signal DD synchronously with a rise edge of the clock signal CK, and provides the output data signal DO at the output terminal Q. The SCD 2 and the D latch 5 together form a single input buffer.

The SCD 2 of FIG. 9 has the transition detector 10 disposed to detect a rise transition of the input data signal DI and to provide the pulse signal CE representative of such detection, a first stage 100, and a second stage 200.

The first stage 100 is made up of a first variable delay line 120 for generating a delayed data signal XD which lags the input data signal DI by a variable delay amount VD1 and a first phase comparator 140 for comparing a rise transition of the delayed data signal XD with a phase of the clock signal CK. On the condition that the pulse signal CE is sent from the transition detector 10, the first phase comparator 140 provides a first control signal SL1 or a second control signal SR1 to the first variable delay line 120. In other words, when a rise transition of the delayed data signal XD leads a fall edge of the clock signal CK, the first phase comparator 140 provides the first control signal SL1 to the first variable delay line 120 for increasing the variable delay amount VD1 of the first variable delay line 120. On the other hand, when the rise transition of the delayed data signal XD lags the fall edge of the clock signal CK, the first phase comparator 140 provides the second control signal SR1 to the first variable delay line 120 for decreasing the variable delay amount VD1 of the first variable delay line 120.

The second stage 200 is made up of a second variable delay line 220 for generating a further delayed data signal YD which lags the delayed data signal XD by a variable delay amount VD2 and a second phase comparator 240 for comparing a rise transition of the delayed data signal YD with a phase of the clock signal CK. The second variable delay line 220 is made up of a first unit 221 for generating the delayed data signal DD which lags the delayed data signal XD by a variable delay amount (½ of the delay amount VD2) and a second unit 222 for generating the further delayed data signal YD which lags the generated delayed data signal DD by the same delay amount as the first unit 221 (½ of the delay amount VD2). On the condition that the pulse signal CE is sent from the transition detector 10, the second phase comparator 240 provides a third control signal SL2 or a fourth control signal SR2 to the second variable delay line 220. In other words, when a rise transition of the delayed data signal YD leads a rise edge of the clock signal CK, the second phase comparator 240 provides the third control signal SL2 to the second variable delay line 220 for increasing the variable delay amount VD2 of the second variable delay line 220. On the other hand, when the rise transition of the delayed data signal YD lags the rise edge of the clock signal CK, the second phase comparator 240 provides the fourth control signal SR2 to the second variable delay line 220 for decreasing the variable delay amount VD2 of the second variable delay line 220.

The transition detector 10 of FIG. 9 is identical in internal structure with the transition detector 10 of FIG. 2. The internal structure of the first and second variable delay lines 120 and 220 is identical with the one shown in FIG. 3. The first phase comparator 140 has the same internal structure as the phase comparator 40 of FIG. 4, except for partial modifications made for the fall edge of the clock signal CK.

The second phase comparator 240 has the same internal structure as the phase comparator 40 of FIG. 4.

Figure 10:
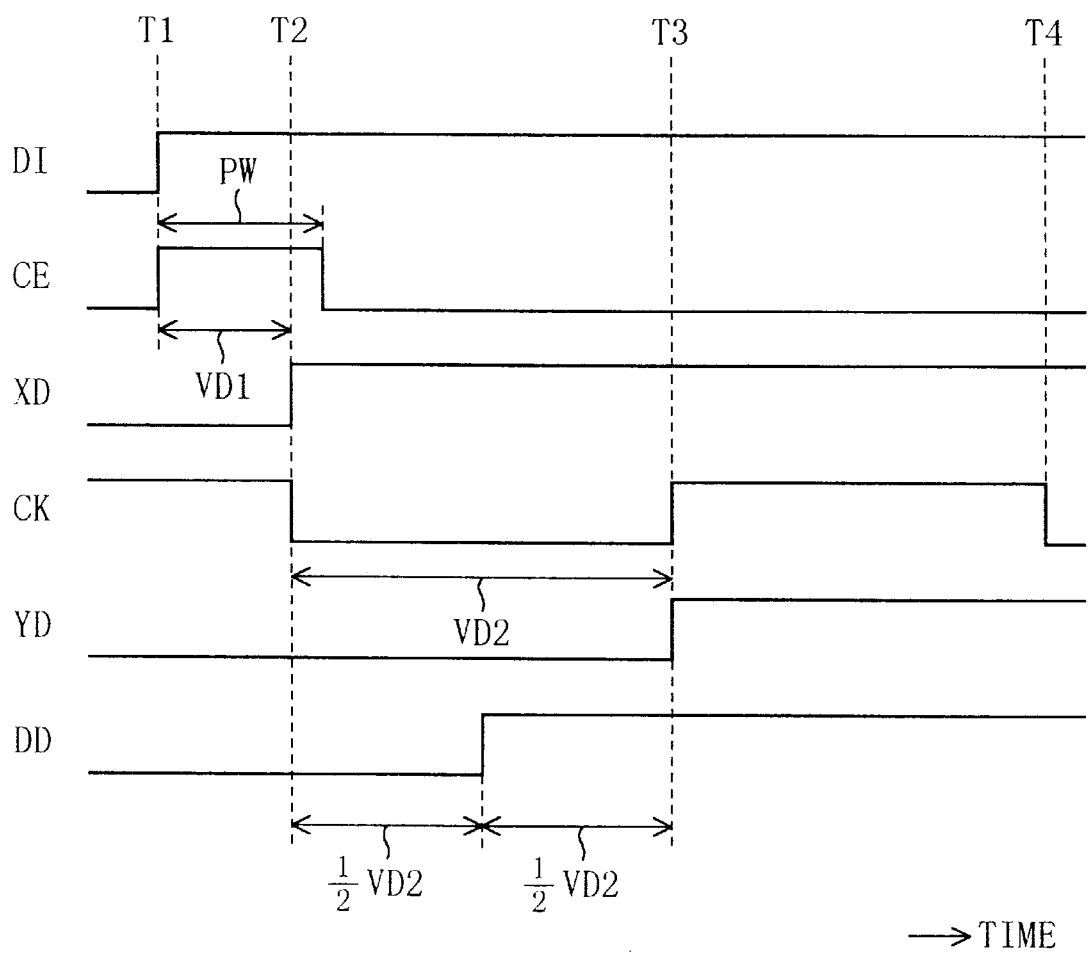
FIG. 10 is a timing diagram depicting a phase relationship among six different signals of FIG. 9 at a point in time when a skew compensation operation is completed.

FIG. 10 shows a phase relationship among the six signals (DI, CE, XD, CK, YD, and DD) of FIG. 9 at a point in time when a skew compensation operation is completed. FIG. 10 shows that the input data signal DI makes a transition in level from LOW to HIGH at time T1. The transition detector 10 detects such a transition and provides the pulse signal CE having a pulse width of PW to the first phase comparator 140 and to the second phase comparator 240. As a result, the first and second phase comparators 140 and 240 are placed in the enable state. Meanwhile, the first variable delay line 120 generates the delayed data signal XD which lags the input data signal DI by the delay amount VD1, at which time the first phase comparator 140 controls the delay amount VD1 of the first variable delay line 120 by time T3 (the rise time of the clock signal CK) so that a rise transition of the delayed data signal XD is substantially matched in phase with a fall edge of the signal CK at time T2. The second variable delay line 220 generates the further delayed data signal YD which lags the delayed data signal XD by the delay amount VD2, at which time the second phase comparator 240 controls the delay amount VD2 of the second variable delay line 220 by time T4 (the fall time of the clock signal CK) so that a rise transition of the delayed data signal YD is substantially matched in phase with a rise edge of the signal CK at time T3. This means that a rise transition of the delayed data signal DD taken out from the centre of the second variable delay line 220 leads a rise edge of the clock signal CK at time T3 by ½ of the delay amount VD2. Accordingly, for the D latch 5 of FIG. 9, a length of time equal to ½ of the delay amount VD2 of the second variable delay line 220 is secured as a setup time of the signal DD with respect to the rise edge of the clock signal CK. A rise transition of the delayed data signal DD lags a fall edge of the clock signal CK at time T2 by ½ of the delay amount VD2, so that a length of hold time equal to ½ of the delay amount VD2 is secured for the previous data.

The initial setting of the first and second variable delay lines 120 and 220 is carried out in setup mode when power is turned on. Quick completion of the initial setting in a setup mode can be achieved by just making the signals DI and CK change in state at the same cycle. Even in normal operating mode, the skew compensation device 2 of FIG. 9 is able to perform a skew compensation operation according to environmental changes such as an increase in temperature. When the signal DI makes no transitions thereby being held in a constant logical level, the first and second phase comparators 140 and 240 are kept in the disable state, so that the setting of the first and second variable delay lines 120 and 220 will not be changed at random.

Replacement of the AND gate 12 of FIG. 2 with a NOR gate makes it possible to generate a pulse signal representative of detection of a fall transition of the input data signal DI. The operation of the phase comparator can be controlled using such a pulse signal.

What is claimed is:

1. A skew compensation device for compensating for a skew between an input data signal and a clock signal, comprising:

(a) a transition detector for detecting a transition of said input data signal and for providing a pulse signal representative of said transition detection, (b) a variable delay line for generating a first delayed data signal which lags said input data signal by a variable delay amount, (c) a fixed delay line for generating a second further delayed data signal which lags said first delayed data signal by a fixed delay amount, (d) a phase comparator for:

comparing a transition of said second delayed data signal with a phase of said clock signal, on the condition that said phase comparator receives said pulse signal from said transition detector, said phase comparator sending to said variable delay line:

a first control signal for increasing said variable delay amount when said transition of said second delayed data signal leads a clocking edge of said clock signal, and a second control signal for decreasing said variable delay amount when said transition of said second delayed data signal lags said clocking edge of said clock signal, and (e) means for outputting said first delayed data signal and said clock signal to data and clock input terminals of a data receiving component, respectively.

2. A skew compensation device for compensating for a skew between an input data signal and a clock signal, comprising:

(a) a transition detector for detecting a transition of said input data signal and for providing a pulse signal representative of said transition detection, (b) a variable delay line for generating a first delayed data signal which lags said input data signal by a variable delay amount, (c) a fixed delay line for generating a second further delayed data signal which lags said first delayed data signal by a fixed delay amount, (d) a phase comparator for:

comparing a transition of said second delayed data signal with a phase of said clock signal, on the condition that said phase comparator receives said pulse signal from said transition detector, said phase comparator sending to said variable delay line:

a first control signal for increasing said variable delay amount when said transition of said second delayed data signal leads a clocking edge of said clock signal, and a second control signal for decreasing said variable delay amount when said transition of said second delayed data signal lags said clocking edge of said clock signal, and (e) means for outputting said first delayed data signal, wherein said phase comparator has a latch which is moved to a set-state when said pulse signal from said transition detector is asserted, and which is moved to reset-state when said first or second control signal is asserted, and wherein said first and second control signals are asserted only when said latch is in said set-state.

3. A skew compensation device for compensating for a skew between an input data signal and a clock signal, comprising:

(a) a transition detector for detecting a transition of said input data signal and for providing a pulse signal representative of said transition detection, (b) a first variable delay line for generating a first delayed data signal which lags said input data signal by a variable delay amount, (c) a first phase comparator for:

comparing a transition of said first delayed data signal with a phase of said clock signal, on the condition that said first phase comparator receives said pulse signal from said transition detector, said first phase comparator sending to said first variable delay line:

a first control signal for increasing said variable delay amount of said first variable delay line when said transition of said first delayed data signal leads a first clocking edge of said clock signal, and a second control signal for decreasing said variable delay amount of said first variable delay line when said transition of said first delayed data signal lags said first clocking edge of said clock signal, (d) a second variable delay line for generating a second further delayed data signal which lags said first delayed data signal by a variable delay amount, (e) a second phase comparator for:

comparing a transition of said second delayed data signal with said phase of said clock signal, on the condition that said second phase comparator receives said pulse signal from said transition detector, said second phase comparator sending to said second variable delay line:

a third control signal for increasing said variable delay amount of said second variable delay line when said transition of said second delayed data signal leads a second clocking edge of said clock signal, and a fourth control signal for decreasing said variable delay amount of said second variable delay line when said transition of said second delayed data signal lags said second clocking edge of said clock signal, and (f) means for outputting a delayed data signal at an intermediate node of said second variable delay line.

4. The skew compensation device as set forth in claim 3, said second variable delay line having:

(a) a primary unit for generating a delayed data signal which lags said first delayed data signal by a variable delay amount, and (b) a secondary unit for providing, as said second delayed data signal, a further delayed data signal which lags said delayed data signal generated by said primary unit by the same variable delay amount as said primary unit, wherein said delayed data signal generated by said primary unit is output from said skew compensation device.

5. A skew compensation device for compensating for a skew between an input data signal and a clock signal, comprising:

(a) a transition detector for detecting a transition of said input data signal and for providing a pulse signal representative of said transition detection, (b) a variable delay line for generating a first delayed data signal which lags said input data signal by a variable delay amount, (c) a fixed delay line for generating a second further delayed data signal which lags said first delayed data signal by a fixed delay amount, (d) a phase comparator for:

comparing a transition of said second delayed data signal with a phase of said clock signal, on the condition that said phase comparator receives said pulse signal from said transition detector, said phase comparator sending to said variable delay line:

a first control signal for increasing said variable delay amount when said transition of said second delayed data signal leads a clocking edge of said clock signal, and a second control signal for decreasing said variable delay amount when said transition of said second delayed data signal lags said clocking edge of said clock signal, and (e) means for outputting said first delayed data signal, wherein at least one of said variable delay amount and said fixed delay amount is adjusted so that a transition timing of said second delayed data signal from said fixed delay line lags a launching timing of said pulse signal from said transition detector.

* * * * *